(12) United States Patent
Jha et al.

(10) Patent No.: US 8,288,814 B2
(45) Date of Patent: Oct. 16, 2012

(54) VIA DEFINITION FOR SEMICONDUCTOR DIE

(75) Inventors: Pankaj K Jha, Chandigarh (IN); Rajesh Bansal, New Delhi (IN); Chetan Verma, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 340 days.

(21) Appl. No.: 12/620,534

(22) Filed: Nov. 17, 2009

(65) Prior Publication Data

US 2010/0181683 A1 Jul. 22, 2010

(30) Foreign Application Priority Data

Jan. 28, 2009 (IN) .............................. 156/DEL/2009

(51) Int. Cl.
*H01L 29/788* (2006.01)

(52) U.S. Cl. ................. 257/316; 438/131; 257/E27.071

(58) Field of Classification Search ................... 257/316, 257/E27.071; 438/131
See application file for complete search history.

(56) References Cited

U.S. PATENT DOCUMENTS

| | | | |
|---|---|---|---|
| 6,841,313 B2 | 1/2005 | Tsai | |
| 7,405,476 B2 | 7/2008 | Delp | |
| 7,420,242 B2 * | 9/2008 | Lung | 257/316 |
| 7,510,907 B2 | 3/2009 | Heck | |
| 7,755,110 B2 * | 7/2010 | Gliese et al. | 257/211 |

* cited by examiner

*Primary Examiner* — S. V. Clark
*Assistant Examiner* — Krista Soderholm
(74) *Attorney, Agent, or Firm* — Charles Bergere

(57) ABSTRACT

A semiconductor die includes a first set of metal lines and a second set of metal lines. The first set of metal lines and the second set of metal lines are placed in alternate planes and are orthogonal to each other. A via is used to connect a first metal line from the first set of metal lines with a second metal line from the second set of metal lines. The via location is offset such that a side of the first metal line is aligned with a side of the second metal line. Consequently, a metal line adjacent to the first metal line does not need to detour around the via.

6 Claims, 3 Drawing Sheets

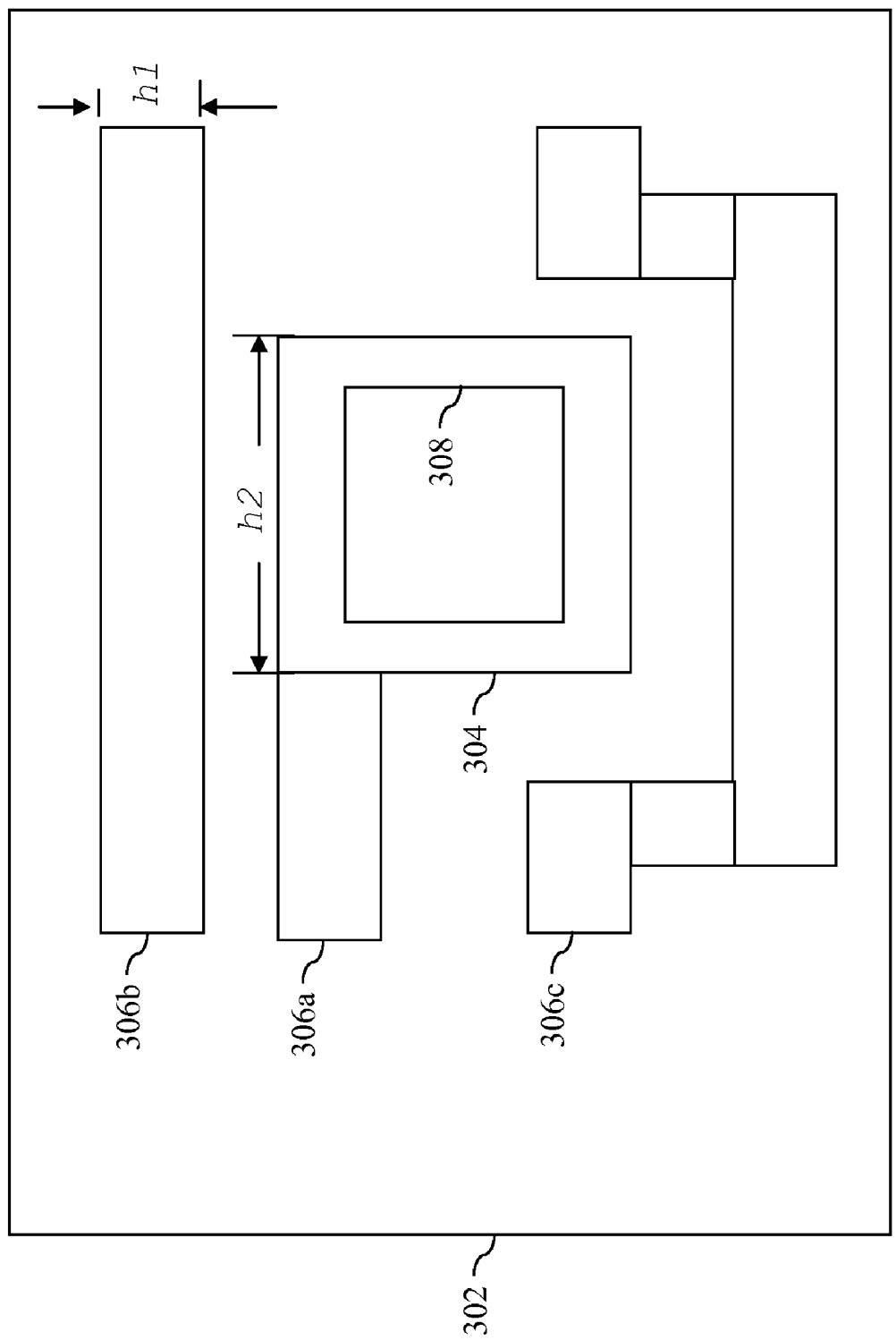

US 8,288,814 B2

VIA DEFINITION FOR SEMICONDUCTOR DIE

BACKGROUND OF THE INVENTION

The present invention relates generally to semiconductor dies, and more specifically, to vias used in semiconductor dies.

A semiconductor die includes various metal layers in which metal lines are formed. The metal lines are used for routing electrical signals such as logic signals, clock signals, and power lines. Metal lines in the same plane are placed at a predetermined pitch from each other. The metal lines in alternate metal layers are perpendicular to each other.

Vias are used to connect a metal line from one metal layer with a metal line in another layer. FIG. 1 illustrates a conventional via structure in a semiconductor die 102. The semiconductor die 102 includes a plurality vertical metal lines such as vertical metal lines 104a, 104b, and 104c; a plurality of horizontal metal lines such as a metal line 106; and a via 108. The vertical metal lines 104a, 104b, and 104c are located in a first plane and the horizontal metal line 106 is located in a second plane, which is adjacent to and above (or below) the first plane. The via 108 connects the horizontal metal line 106 with the vertical metal line 104a. The width (w2) of the horizontal metal line 106 is greater than the width (w1) of the vertical metal lines 104a, 104b, and 104c. Therefore, the via 108 causes the adjacent vertical metal lines, 104b and 104c, on both its sides to detour in order to maintain the predetermined pitch. This detouring wastes routing space. Further, since the semiconductor die 102 will contain many vias, there is a considerable waste of die area. This in turn causes an increase in the die size and thus an increase in die cost.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 3 a schematic diagram illustrating a top view of a horizontal cross-section of a semiconductor die in accordance with another embodiment of the present invention.

DETAILED DESCRIPTION OF THE PRESENT INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a semiconductor die includes a first metal layer having a first set of parallel metal lines, which have a first predetermined width. The metal lines in the first set of parallel metal lines are spaced from each other at a first predetermined pitch. The semiconductor die further includes a second metal layer having a second set of parallel metal lines, which have a second predetermined width. The metal lines in the second set of parallel metal lines are spaced from each other at a second predetermined pitch. The first and second sets of metal lines are orthogonal to each other and located in alternate planes. A via connects a first metal line of the first set of metal lines with a second metal line of the second set of metal lines. The via is offset such that at least one side of the first metal line is aligned with a side of the second metal line such that a line adjacent to the first metal line does not need to detour around the via in order to maintain the first predetermined pitch.

Embodiments of the present invention provide a semiconductor die with an offset via. The via is placed such that at least one side of the first metal line in the first metal layer is aligned with one side of the second metal line in the second metal layer. As a result, at least one of the metal lines of the first set of metal lines adjacent to the first metal line does not need to detour around the via to maintain the first predetermined pitch. As a result, the track area and hence, die area are saved. Consequently, the die cost is also reduced.

Figure 1:
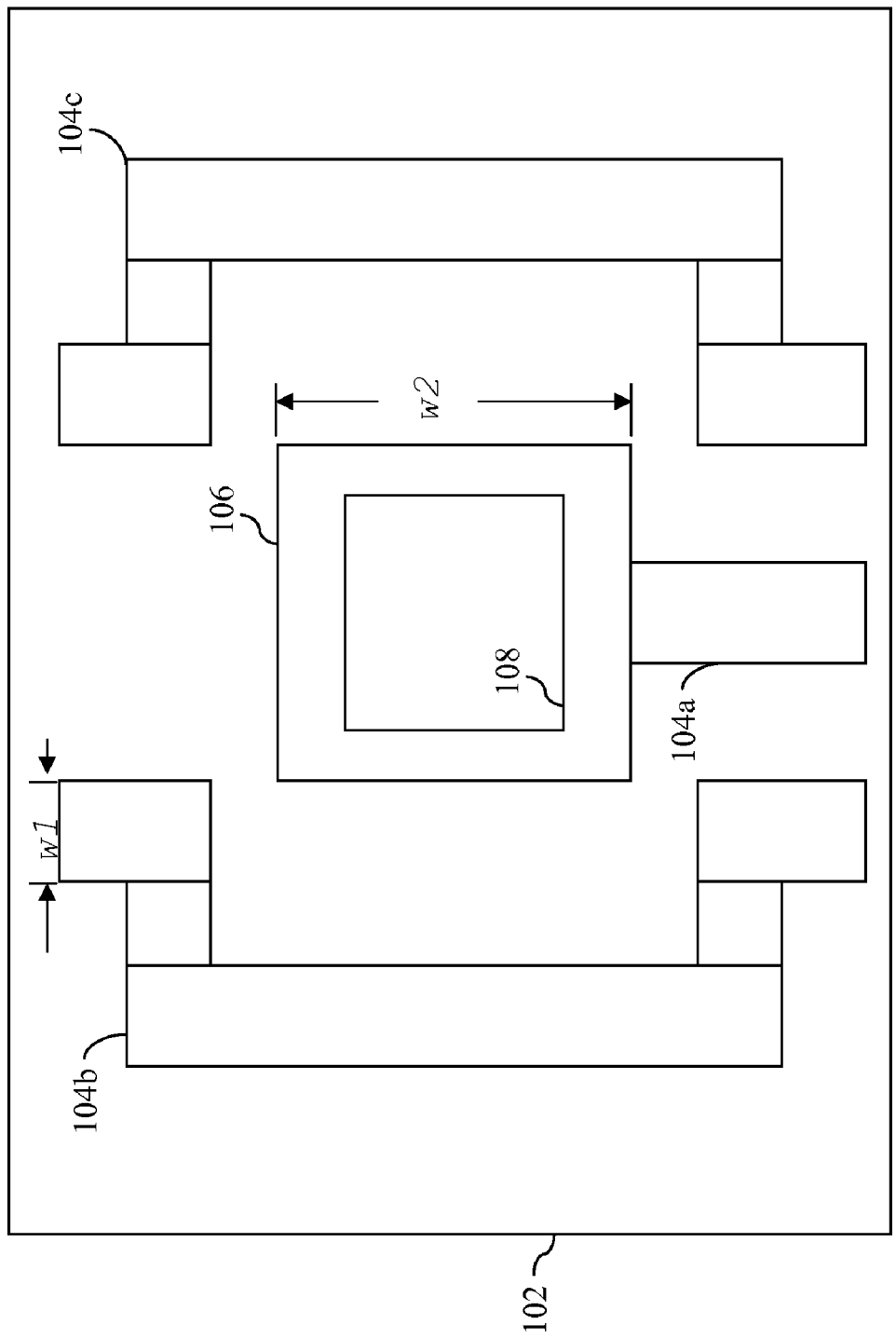
FIG. 1 is a schematic diagram illustrating a top view of a horizontal cross-section of a conventional semiconductor die.
Figure 2:
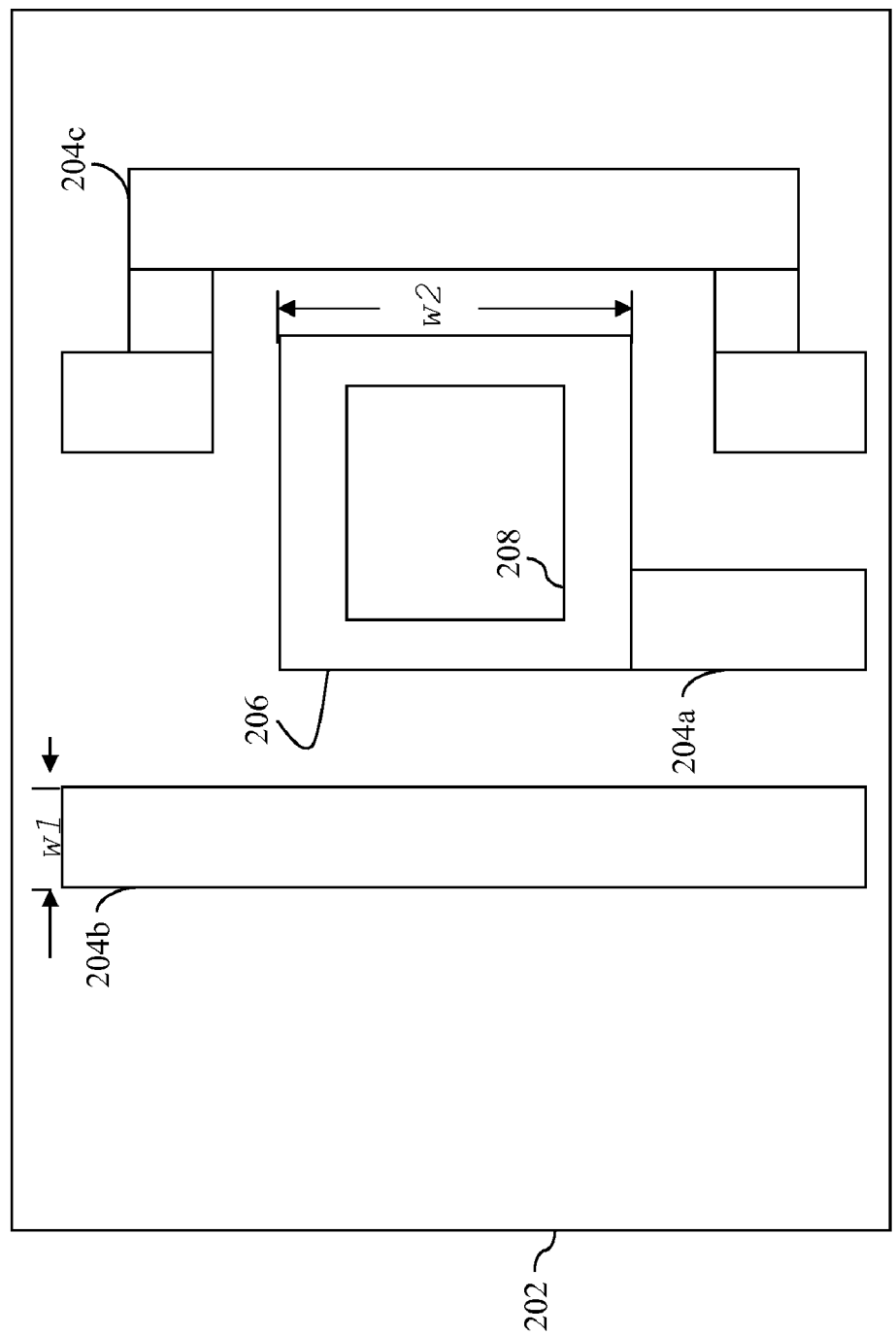
FIG. 2 a schematic diagram illustrating a top view of a horizontal cross-section of a semiconductor die in accordance with an embodiment of the present invention.

Referring now to FIG. 2, a schematic diagram illustrating a top view of a horizontal cross-section of a semiconductor die 202 is shown, in accordance with an embodiment of the present invention. The semiconductor die 202 includes a plurality vertical metal lines such as vertical metal lines 204a, 204b, and 204c; a plurality of horizontal metal lines such as horizontal metal line 206; and a plurality of vias 208 (one of which is shown). The vertical metal lines 204a, 204b, and 204c are located in a first metal layer and are parallel to each other. Each of the vertical metal lines 204a, 204b, and 204c has a first predetermined width (w1) and are spaced from each other at a first predetermined pitch.

The horizontal metal line 206 is located in a second metal layer. Each of the horizontal metal lines 206 has a second predetermined width (w2) and are spaced from each other at a second predetermined pitch. The width of the horizontal metal line 206 is greater than the width of the vertical metal line 204a.

The vertical metal lines 204 and the horizontal metal lines 206 are orthogonal to each other. Further, the vertical metal lines 204 and the horizontal metal lines 206 are located in alternate planes inside the semiconductor die 202.

The via 208 connects the horizontal metal line 206 with the vertical metal line 204a. The via 208 is placed such that at least one side of the vertical metal line 204a is aligned with one side of the horizontal metal line 206. That is, as compared to the via 108 of the conventional die 102, the via 208 is offset. In the embodiment shown, the left side of the line 204a is aligned with the left side of the line 206. Consequently, the vertical metal line 204b does not need to detour around the via 208 and thus the immediately adjacent track on the left side is available for routing purposes. In another embodiment of the present invention, the via 208 is offset so that the right edge of the line 206 is aligned with the right edge of the vertical metal line 204a. In this case, the vertical metal line 204c does not need to detour around the via 208 and consequently the immediately adjacent track on the right side is available for routing purposes.

In one embodiment of the present invention, the vertical metal line 204a and the horizontal metal line 206 are used for signal routing. In another embodiment of the present invention, the vertical metal line 204a and the horizontal metal line 206 are used for power routing. In yet another embodiment of the present invention, the vertical metal line 204a and the horizontal metal line 206 are used for clock routing. In various embodiments of the present invention, the via 208 is a cuboid.

Referring now to FIG. 3, a schematic diagram illustrating a top view of a horizontal cross-section of a semiconductor die 302 is shown, in accordance with another embodiment of the present invention. The semiconductor die 302 includes a plurality of vertical metal lines such as vertical metal line 304, a plurality horizontal metal lines such as horizontal metal lines 306a, 306b, and 306c; and a plurality of vias 308 (only one of which is shown).

The horizontal metal lines 306a, 306b, and 306c are located in a first metal layer and are parallel to each other. Each of the horizontal metal lines 306a, 306b, and 306c has a first predetermined height (h1) and are spaced from each other at a first predetermined pitch.

The vertical metal line 304 is located in a second metal layer. Each of the vertical metal lines 304 has a second predetermined height (h2) and are spaced from each other at a second predetermined pitch. The height (h2) of the vertical metal line 304 is greater than the height (h1) of the horizontal metal line 306a. The vertical metal lines 304 and the horizontal metal lines 306 are orthogonal to each other and are located in alternate planes inside the semiconductor die 302.

A via 308 connects the vertical metal line 304 with the horizontal metal line 306a. The via 308 is placed such that at least one side of the vertical metal line 304 is aligned with one side of the horizontal metal line 306a.

In an embodiment of the present invention, the upper edge of the vertical metal line 304 is aligned with the upper edge of the horizontal metal line 306a. Consequently, the horizontal metal line 306b does not need to detour around the via 308 and thus, the immediately adjacent upper track is available for routing purposes. In another embodiment of the present invention, the lower edge of the vertical metal line 304 is aligned with the lower edge of the horizontal metal line 306a. In this case, the horizontal metal line 306c does not need to detour around the via and thus, the immediately adjacent lower track is available for routing purposes.

The horizontal metal lines 306 and the vertical metal lines 304 may be used for logic signal routing, clock signal routing, or power and ground line routing. In various embodiments of the present invention, the via 308 is a cuboid.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A semiconductor die, comprising:
   a first metal layer having a first set of parallel metal lines that have a first predetermined width and spaced from each other at a first predetermined pitch;
   a second metal layer having a second set of parallel metal lines with a second predetermined width, and spaced from each other at a second predetermined pitch, wherein the first and second sets of metal lines are orthogonal to each other and lie in alternate planes; and
   a metal via that connects a first metal line of the first set of metal lines with a second metal line of the second set of metal lines, wherein the via is placed such that at least one side of the first metal line is aligned with at least one side of the second metal line so that at least one of the metal lines of the first set of metal lines adjacent to the first metal line does not detour around the via in order to maintain the first predetermined pitch.

2. The semiconductor die of claim 1, wherein the second predetermined width of the second set of metal lines is greater than the first predetermined width of the first set of metal lines.

3. The semiconductor die of claim 1, wherein each of the first metal line and the second metal line is used for signal routing.

4. The semiconductor die of claim 1, wherein each of the first metal line and the second metal line is used for power routing.

5. The semiconductor die of claim 1, wherein each of the first metal line and the second metal line is used for clock routing.

6. The semiconductor die of claim 1, wherein the via is a cuboid.

* * * * *